United States Patent [19]
Fisher et al.

[11] Patent Number: 5,371,709
[45] Date of Patent: Dec. 6, 1994

[54] POWER MANAGEMENT SYSTEM FOR SERIAL EEPROM DEVICE

[75] Inventors: Richard J. Fisher, Phoenix; Samuel E. Alexander, Gilbert, both of Ariz.

[73] Assignee: Microchip Technology Incorporated, Chandler, Ariz.

[21] Appl. No.: 41,067

[22] Filed: Apr. 1, 1993

[51] Int. Cl.$^5$ ............................................. G11C 5/14
[52] U.S. Cl. .................................... 365/226; 365/227
[58] Field of Search ................ 365/226, 227, 228, 229

[56] References Cited
U.S. PATENT DOCUMENTS 5,001,670  3/1991  Slate ..................................... 365/229
5,070,481 12/1991  Haubner .............................. 365/226
5,121,007  6/1992  Aizaki ................................. 365/226

Primary Examiner—Eugene R. LaRoche
Assistant Examiner—A. Zarabian
Attorney, Agent, or Firm—O'Connor Cavanagh

[57] ABSTRACT

Power consumption of a serial EEPROM is reduced while simultaneously precluding data corruption during write operations. These results are achieved by operating a brownout detector in the device to sense EEPROM supply voltage below a predetermined level and thereupon to place the EEPROM in a reduced power mode, but only during an interval that a write sequence is taking place. Such an interval includes loading of data in a temporary storage cache and writing the loaded data into the EEPROM. At the same time that the low voltage level is detected during a write sequence, any load or write operation then in progress is aborted. The brownout detector is intentionally left disabled or in a sleep mode during any read mode or standby mode since there is no jeopardy of corrupting the EEPROM memory during those times.

9 Claims, 4 Drawing Sheets

POWER MANAGEMENT SYSTEM FOR SERIAL EEPROM DEVICE

BACKGROUND OF THE INVENTION

The present invention relates generally to semiconductor integrated circuit (IC) memory chips or devices, and more particularly to serial erasable programmable memory devices such as electrically erasable (alterable) programmable read only memories (serial EEPROMs). EEPROM devices generally have the advantage that data may be written and rapidly erased electrically many times over, to permit a user to modify stored data at will while the device is in circuit.

ROM devices are permanently mask-programmed at the factory so that no subsequent data modification is permitted. Originally, programmable ROMs (PROMs) employed fusible links in which data is stored according to the condition of the fuses at intersections of the memory array, i.e., the condition of whether or not a fuse is blown. Such PROM devices are programmable only once (that is, are non-erasable) since a blown fuse is not reparable.

EPROM devices require exposure of the unhoused structure to ultraviolet (UV) light to change the electrical characteristics of a charged element in order to obtain erasure. Typically, the EPROM is housed in a windowed package (e.g., a ceramic package having a quartz window to expose the silicon), although a more recent version dubbed as "one time programmable" (OTP) is packaged in plastic without a window. As the name indicates, the windowless variety can be programmed only once. The usual windowed EPROM is reprogrammable after removal from its in-system circuit, by exposing the device to UV for a sufficient period of time (several hours) to assure complete erasure, then electrically reprogramming and reinstalling it in the circuit.

Since EEPROM devices are rapidly erasable in circuit, they are the memory devices of choice in applications where in-system changes of stored data and/or relatively fast data changes may be required. Serial EEPROMs are nonvolatile memories that provide small footprint and board space as required in cellular phone applications; byte level erase, write and read of data as needed in television tuner applications; low voltage and current for hand held battery applications such as vehicle keyless entry transmitters; and multiple nonvolatile functions such as remote controls for VCRs. Although the following list is not exhaustive, other applications of serial EEPROM devices include, in the consumer market, CD players, cameras, radios and remote controls; in the automotive market, airbags, anti-lock brakes, odometers and radios; in the office automation market, printers, copiers and personal computers; in the telecommunications market, cordless and full feature phones, fax machines, modems, pagers and satellite receivers: and in the industrial market, bar code readers, POS terminals, smart cards, lock boxes, garage door openers and test measurement equipment.

In the EEPROM structure, a pair of polysilicon gates are separated by a silicon dioxide layer. The oxide also extends below the lower gate to separate it from underlying p-type silicon substrate in which a channel may be established between implanted heavily doped n-type source and drain regions. The oxide thickness between the lower gate and the silicon typically ranges up to about 100 angstroms, which is considerably less than the gate oxide thickness used for EPROM structures.

In operation of an EEPROM, a voltage of suitable magnitude applied across the very thin gate oxide layer induces tunneling of electrons from the substrate to the lower gate. A logical 1 is stored (written) when a write voltage is applied to the upper gate, thus inducing a charge on the lower gate that prevents a channel from forming during a read operation. A reversal of the write voltage causes erasure.

It is imperative that the power supply of the EEPROM device be maintained at a sufficiently high voltage level to assure an internal programming voltage adequate to write the memory completely. The need becomes more acute where the device is designed to operate at low voltage, such as in battery-operated CMOS (complementary metal-oxide-silicon) design applications at less than 6 volts and even below 2 volts. The EEPROM may be written to at any time, and if the power supply is unregulated the data may be only partially written. The non-electrically erasable EPROM does not face this problem, because it is programmed with a 12 volt supply level.

The need for constant monitoring of the supply voltage to the EEPROM chip ($V_{DD}$) has led to the inclusion of a brownout detector in circuit to detect voltage spikes and consequent loss or corruption of data. If the supply voltage drops to a level below that required to write the EEPROM, even if only momentary, the brownout detector detects this deficiency and aborts any pending write operation. Consequently, there is no chance of data corruption through incomplete writes. However, among other problems associated with them, brownout detectors implemented in MOS technology draw power—at a level of consumption that may not be acceptable in battery applications.

Heretofore, the typical solution to this problem has been to use non-brownout detect circuits to control the semiconductor chip, which can aggravate the problem of a collapsing $V_{DD}$ (i.e., a weak battery). A non-brownout detect circuit, or what is typically called a power-on-reset (POR) circuit, holds the device in reset while the power supply is slewing up to its final value. Once the supply voltage is sufficiently high, the POR circuit will enable the device and turn itself off. Thereafter, if any supply spikes occur the POR circuit is unable to detect them, since it is turned off, with the result that the device may behave incorrectly.

Accordingly, it is a principal object of the present invention to provide improvements in power management of erasable programmable memory arrays, and especially for serial EEPROM devices.

SUMMARY OF THE INVENTION

Briefly, according to the present invention a serial EEPROM device is provided with a power management system in which a brownout detector is turned on only when a write command is being executed, to constantly check the $V_{DD}$ integrity during that portion of the device operating mode. At the completion of the write cycle, the device is returned to its normal power down mode so that battery energy will not be consumed excessively. Consequently, during most of its operation (i.e., the non-write mode), little or no power is drawn by the device.

If the detected battery voltage is too low for the EEPROM to execute a write command, the device will not supply an acknowledge signal to a master or controlling device, such as the CPU of a microcontroller, after receiving the next data byte. This disallows any pending write operation. As a result, the brownout detector serves its primary function of eliminating data corruption that would otherwise occur from incomplete writes. And because it is fully activated only during a relatively small portion of the device operation, the brownout detector causes relatively little additional power consumption. Further, while a POR-only circuit requires a regulator to detect $V_{DD}$ spikes, a brownout detector circuit will perform both power-on-reset and spike detection.

Therefore, a more specific object of the invention is to provide an EEPROM in which the supply voltage level is monitored substantially only during execution of a write cycle, to provide the necessary assurance of the supply voltage integrity.

Another object of the invention is to provide a serial EEPROM in which brownout detection is performed only during programming of the memory, and at other times the device is maintained in a power-down or sleep mode.

BRIEF DESCRIPTION OF THE DRAWINGS

The above and other objects, features and advantages of the invention will become clear from the following detailed description of the best mode presently contemplated for practicing the invention, with reference to the accompanying drawings in which.

DETAILED DESCRIPTION OF THE PREFERRED EMBODIMENT AND METHOD

Figure 1:
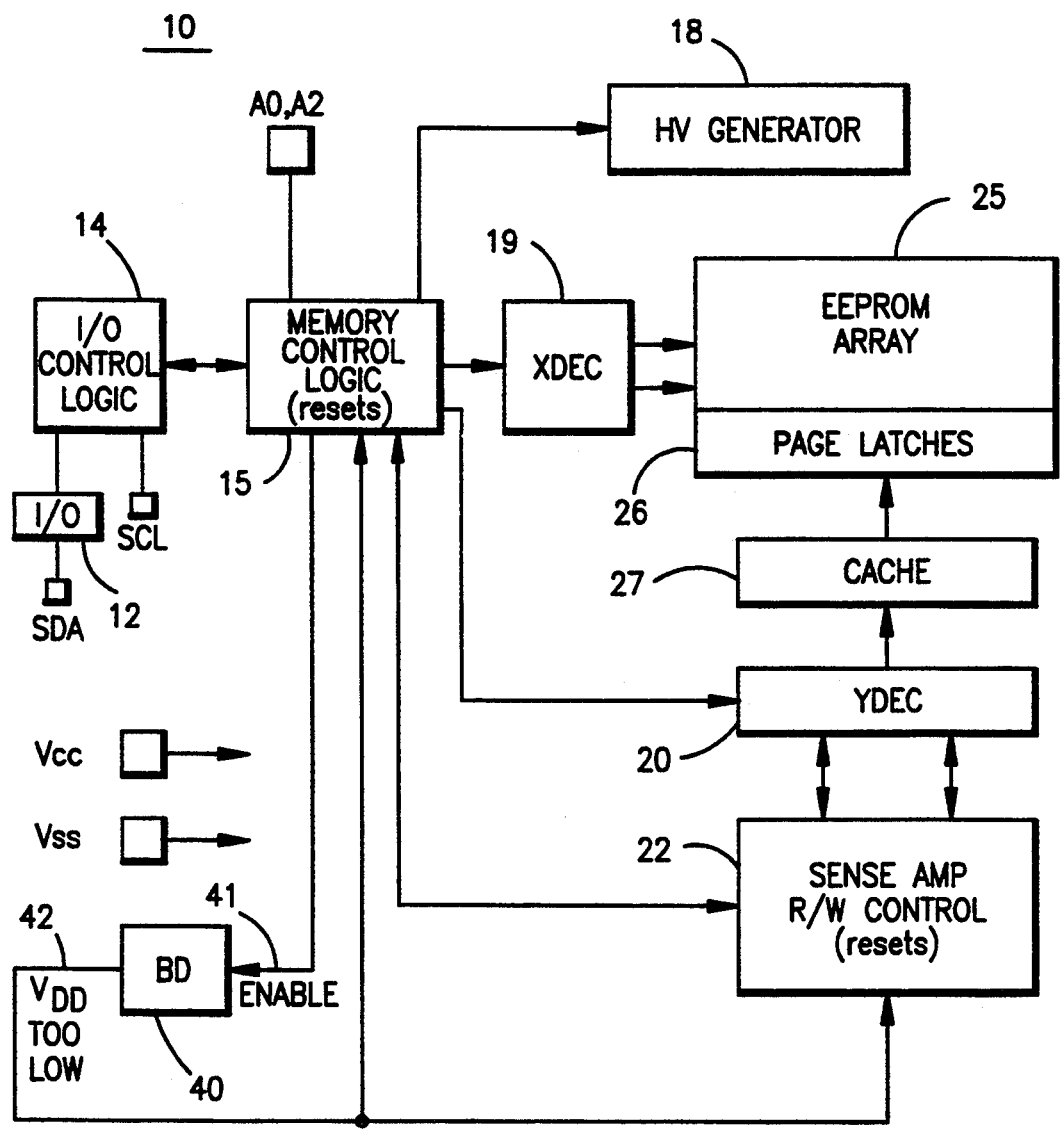
FIG. 1 is a block diagram of a serial EEPROM in which the preferred embodiment of the invention is implemented.

In an exemplary embodiment, the invention is implemented in a 64K (8K × 8) low voltage serial EEPROM 10 (FIG. 1) which is particularly well suited for low power applications of the type mentioned above.

EEPROM 10 has pins A0, . . . , An, such as A0, A1 and A2 user configurable chip selects, and pins SDA (serial address/data input/output (I/O)) and SCL (serial clock). The A0, A1 and A2 chip address inputs are used for multiple device operation and may conform to the I²C bus standard. The level on these pins defines the address block occupied by the device in an address map, so that the address may be compared to the corresponding bits in a slave address to select a particular device from among several.

The bidirectional SDA pin transfers addresses and data into the device, and data out of the device. For normal data transfer, SDA changes are allowed only during SCL low. Changes during SCL high are reserved for start and stop conditions described below. The SCL serial clock input synchronizes data transfer from and to the device.

Pins $V_{SS}$ and $V_{cc}$ provide electrical ground and power supply (e.g., +1.8V to 5.5V), respectively, relative to battery $V_{DD}$.

I/O interface 12 and I/O control logic 14 communicate with memory control logic 15 which supplies inputs to HV (high voltage) generator 18, XDEC (X-line decoder) 19 and YDEC (Y-line decoder) 20 and also communicates with sense AMP (amplifier) R/W (read/write) control 22. The XDEC controls EEPROM array 25 with page latches 26 controlled by cache 27 and YDEC 20 which also communicates with sense AMP R/W control 22.

Device 10 is fabricated using CMOS process technology for low power nonvolatile code and data applications. It may be packaged, for example, in an 8 pin (A0, A1, A2, $V_{SS}$, $V_{CC}$, NU (not used), SCL and SDA) DIP (dual in-line package) or SOIC (small outline integrated circuit) package.

According to the invention, a brownout detector circuit 40 is connected in-circuit between memory control logic 15 and sense amplifier 22 for limited operation in the circuit of the device. The specific connections and operation of the detector will be discussed in detail in connection with the description of FIG. 7 below.

Figure 2A:
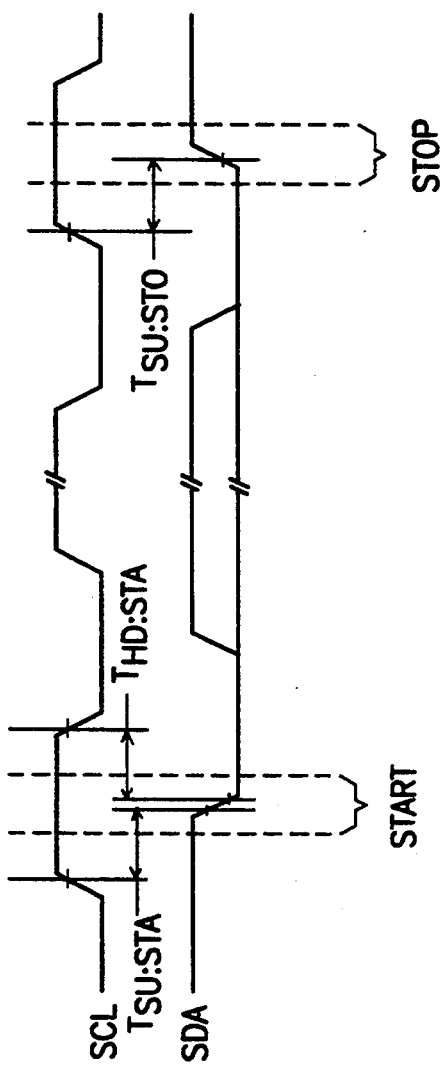
FIGS. 2A and 2B are timing diagrams for the data transmission bus of the device of FIG. 1.
Figure 2B:
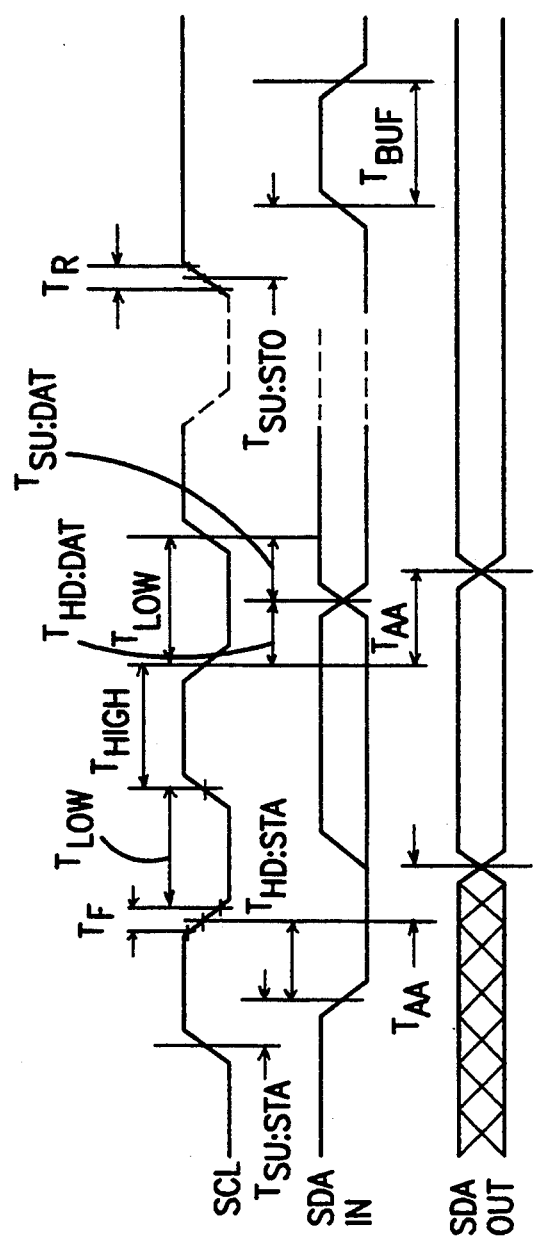

The EEPROM supports a bidirectional two wire bus and data transmission protocol. Bus timing start/stop and bus timing data are illustrated in FIGS. 2A and 2B, respectively. In the protocol, a transmitter sends data onto the bus, and a receiver receives the data. The bus is controlled by a master device that generates the serial clock SCL, controls the bus access, and generates start and stop conditions for data transfer. The EEPROM acts as a slave device, and, like the master, can operate as transmitter or receiver, but the master device determines which of those modes is activated.

FIGS. 2A and 2B assume an exemplary clock frequency of 400KHz, with data transfer start and stop conditions generated during selected clock high times $T_{HIGH}$ (e.g., minimum of 600 nanoseconds, ns). The clock high time, and the clock low time $T_{LOW}$ (e.g., 1300 ns), lie between the approximate midpoints of the clock rise time $T_R$ (e.g., maximum of 300 ns) and fall time $T_F$ (e.g., max 300 ns), and vice versa, respectively. The start condition hold time $T_{HD:STA}$ (e.g., min 600 ns) is the period after which the first clock pulse is generated. A start condition setup time $T_{SU:STA}$ (e.g., min 600 ns) is only relevant for repeated start conditions. Analogous considerations exist for stop condition hold time $T_{HD:STO}$ and setup time $T_{SU:STO}$ (e.g., min 600 ns).

Data input hold time and data input setup time are $T_{HS:DAT}$ (e.g., min 0 ns) and $T_{SU:DAT}$ (e.g., min 100 ns) respectively. When EEPROM 10 is a transmitter, it provides an internal minimum delay time $T_{AA}$ (e.g., max 900 ns) to bridge an undefined region (e.g., min 300 ns) of the falling edge of SCL to avoid unintended generation of start and stop conditions. The bus must be free for a time interval designated $T_{BUF}$ (e.g., min 1300 ns) before a new transmission can start.

Figure 3:
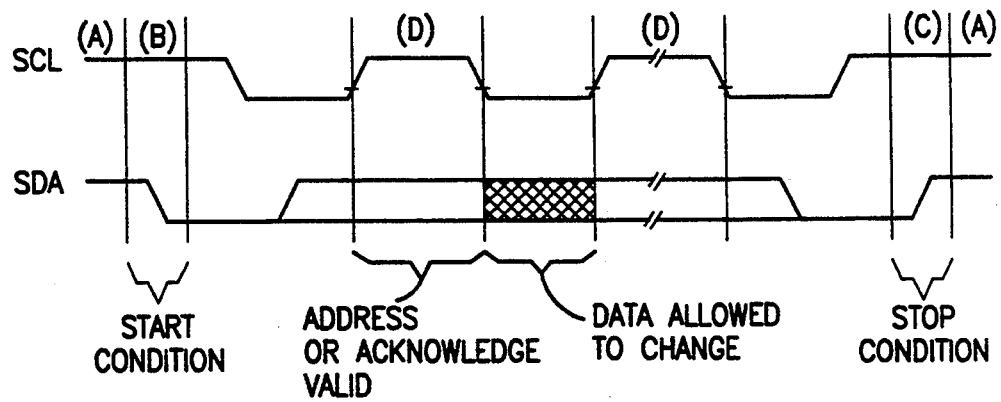
FIG. 3 is a data transfer sequence diagram for the EEPROM's serial bus.

The bus protocol of this 64K serial EEPROM device requires that (i) data transfer may be initiated only when the bus is not busy, and (ii) during data transfer, the data line must remain stable whenever the clock line is high because changes are interpreted as a start or a stop condition. The following bus conditions are thereby defined. In an illustrative data transfer sequence on the serial bus (FIG. 3), the bus is not busy (condition A) when both the data (SDA) and clock (SCL) lines remain high. A start data transfer (start condition, B) is determined by a high to low transition of the SDA line while the SCL line is high. All commands are preceded by a start condition. A stop data transfer (stop condition, C) is determined by a low to high transition of the SDA line while the SCL line is high. All operations are ended with a stop condition.

The state of the data (SDA) line represents valid data (D) when, after a start condition, the data line is stable for the duration of the high period of the clock (SCL) signal. Data on the SDA line may be changed only during the low period of the SCL signal, with one clock pulse for each bit of data. The master device determines the number of data bytes transferred between start and stop conditions, and an acknowledge signal is normally generated by the addressed receiving device after receipt of each byte.

Figure 4:
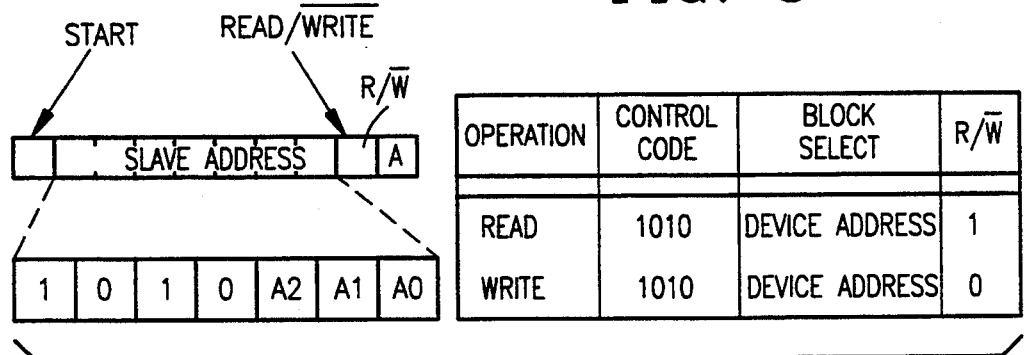
FIG. 4 is a chart illustrating the control byte allocation used for device addressing and operation.

The first byte received from the master after a start condition is a control byte (allocation illustrated in FIG. 4), which includes a four bit control code, set as 1010 binary for read and write operations. The next three bits of the control byte are device select bits used by the master to select which of the eight slave devices is to be accessed. The last bit (R/W) defines the operation to be performed, i.e., read or write. If set to 1, a read operation is selected; if set to 0, a write operation is selected. Bit A in FIG. 4 is the acknowledge bit, sent by the slave to indicate receipt of the previous eight bits. An acknowledge occurs after each byte transmitted in either direction.

The least significant thirteen bits of the next two bytes from the master device define the address of the byte on which the device will perform subsequent read or write operations. Following a start condition, the EEPROM monitors the SDA line for the device type identifier transmitted by the master. On receiving an appropriate code and device select bits, the selected slave outputs an acknowledge signal on the SDA line, and a read or write operation is selected depending on the state of the R/W bit.

Figure 5:
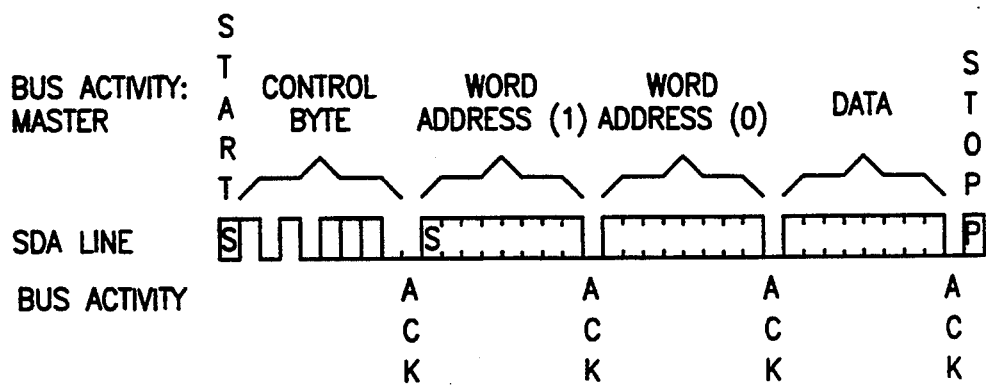
FIG. 5 is a bit stream diagram illustrating byte write operation.

In a byte write operation (FIG. 5), after the start condition the device code, memory block address and R/W bit are transmitted by the master onto the bus. The addressed slave receiver is thereby informed that the word address will follow the control byte, after an acknowledge bit is generated. The word address transmitted by the master is written into an address pointer, and after acknowledgement is followed by transmission from the master of a data word to be written into the addressed memory location. After the slave acknowledges, the master generates a stop condition.

Figure 6:
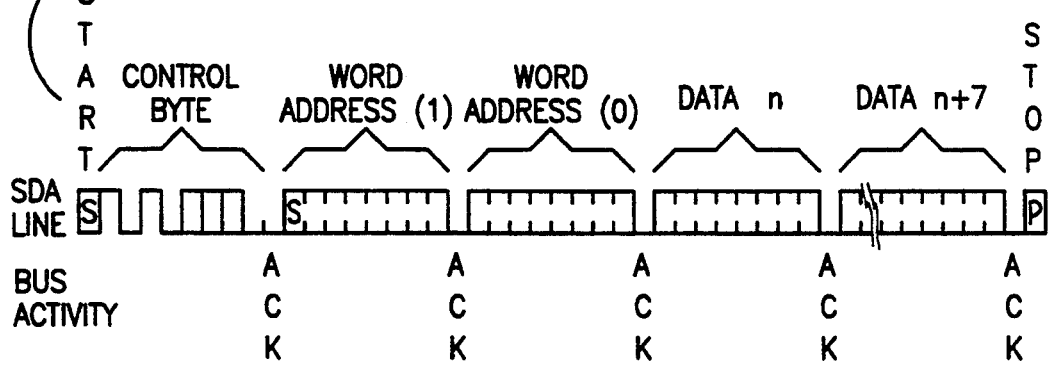
FIG. 6 is a bit stream diagram illustrating page write operation.

In a page write operation (FIG. 6), the write control byte, word address and first data byte are transmitted to EEPROM 10 in the same manner as for a byte write. But after acknowledgement of the data byte, the master transmits up to eight pages of eight data bytes (where the cache is eight pages by eight bytes/page). These are temporarily stored in the on-chip 64-byte page cache 27, to be written into the memory of device 10 after the master transmits a stop condition. As in the byte write case, after receipt of the stop condition the device commences an internal write cycle, except that the cache continues to capture data until another stop condition occurs or the page write operation is aborted.

When writing data, the internal write cycle is executed as an automatic erase-then-write cycle. The total write cycle time interval $T_{WR}$ (erase plus write) is 2 milliseconds (ms) in length, with a maximum length of 10 ms, for a single page of eight bytes. The total time required for loading a greater number of pages into write cache 27 is the single page $T_{WR}$ multiplied by the total number of pages being written.

For purposes of power management of the EEPROM device according to the present invention, the device logic implements several complementary techniques. A power standby (power down or sleep) mode is employed when the device is not in use. An automatic power off takes place after a normal termination of any operation, when a stop bit is received and all internal functions are complete, or upon an error condition when an acknowledge or stop condition is not received. A significant aspect of the invention, however, lies in the use of a brownout detector 40 (FIGS. 1 and 7) which is connected to monitor the supply voltage level of Vhd DD, and is fully turned on only during performance of a write operation. The power consumption of the detector is thereby virtually eliminated at all other times during device operation or standby.

As illustrated in FIG. 1, brownout detector 40 is connected to power supply $V_{CC}$ which allows it to monitor the relative battery voltage level $V_{DD}$. With concurrent reference to FIG. 7, the detector has a BD enable node 41 for receiving an enabling bit or disabling bit from the memory control logic 15 of serial EEPROM device 10. An output node 42 of the brownout detector generates an appropriate bit to reset both memory control logic 15 and sense amplifier 22 and place the device in the power standby mode when $V_{DD}$ drops below a predetermined voltage level. If low level is detected, entry into the power standby mode also causes the device to abort any operation currently being performed. Since the invention prescribes that the detector is operating only during a write operation, the aborted operation will only be either a loading of the data to be written to the memory, or the write itself. Accordingly, incomplete writes due to an insufficient $V_{DD}$ are disallowed and the data will not be corrupted by the low power condition of the supply.

Figure 7:
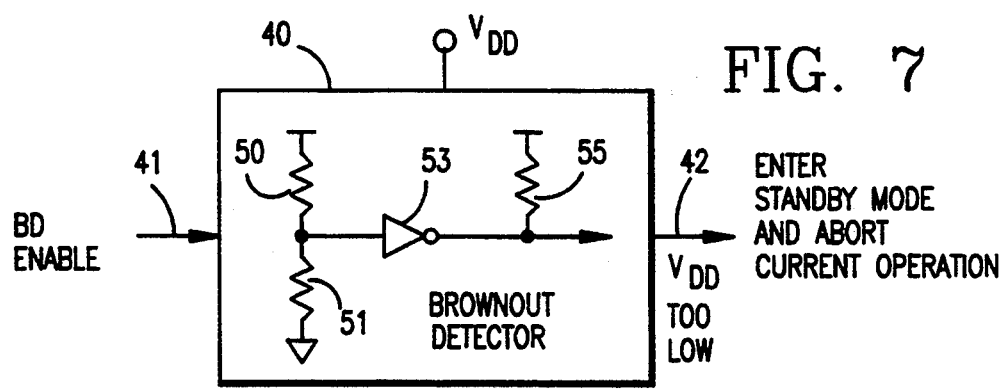
FIG. 7 is a simplified block diagram illustrating the incorporation of a brownout detector in the EEPROM device of FIG. 1.

The brownout detector circuit 40 may be of any conventional design, such as that shown within the detector block in FIG. 7. The circuit includes a resistor divider consisting of resistors 50 and 51 series connected between $V_{DD}$ and $V_{SS}$, an inverter 53 connected between the junction of resistors 50 and 51 and the output node 42 of the detector, and a pull up resistor 55 connected between $V_{DD}$ and output node 42. In operation of the brownout detector, if $V_{DD}$ is too low, pull up resistor 55 pulls output node 42 to $V_{DD}$. If $V_{DD}$ is sufficient, output node 42 is pulled low by inverter 53. Current flows through the resistor divider, the inverter and the pull up resistor. It is this current that is interrupted when the detector is shut down during all but write operations.

Figure 8A:
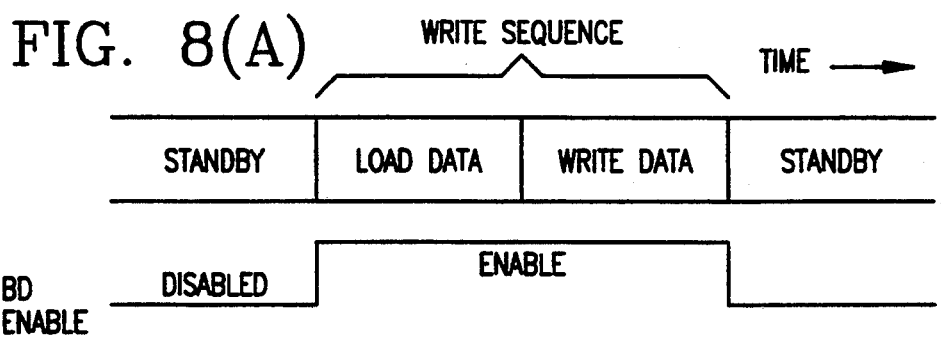
FIGS. 8A and 8B are timing diagrams of operating control of the brownout detector during write and read sequence portions of the operation of the EEPROM device.

As shown in the timing diagram of FIG. 8A, the EEPROM is in the standby mode before and after a write sequence is performed. During the first part of the write cycle, the memory device is put into a load condition in which the data to be programmed is temporarily stored. Upon commencement of the load condition, the brownout detector is turned on by asserting BD enable node 41, and is left on during the entire write cycle.

Brownout detection during the load cycle assures that all data to be written will be stored correctly.

Figure 8B:
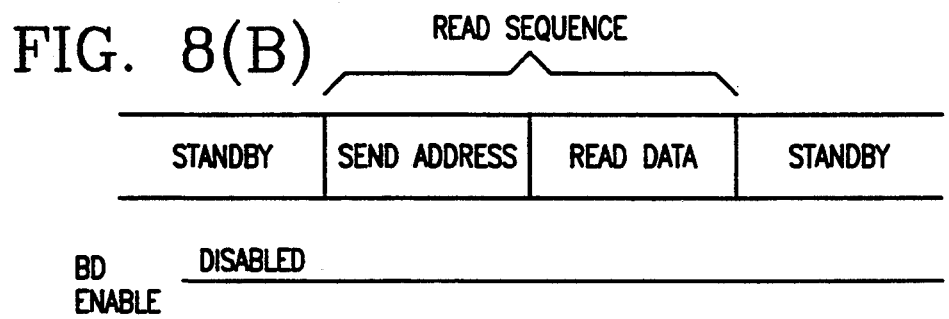

The brownout detector is disabled during a read operation, as shown in the timing diagram of FIG. 8B, because there is no jeopardy that the memory will be corrupted in that interval since the device is only reading. In fact, even if the device were generating corrupted dam, and random data from the system were to address the device and attempt to write it, the brownout detector would abort the operation and ignore any subsequent bus transmission, until a start bit is received.

A preferred embodiment constituting the best mode presently contemplated for practicing the invention has been described. However, it will be apparent to those skilled in the art that modifications may be made without departing from the true spirit and scope of the invention. Accordingly, it is intended that the invention shall be limited only as required by the appended claims and the rules and principles of applicable law.

What is claimed is:

1. An erasable programmable memory device operating with a fixed supply voltage, comprising:

a plurality of addressable locations for storing dam, means for programmably writing data to at least one of said locations as part of a write sequence of the device, means for selectively reading data from at least one of said locations as part of a read sequence of said device, brownout means for detecting when the supply voltage level is below a predetermined value, and in response, aborting current operation of the device, and timing means for powering on the brownout detection means only during a write sequence of the device.

2. The device of claim 1, in which the brownout detection means includes means for placing the device in a power standby mode when the supply voltage level is below said predetermined value.

3. A battery powered electrically erasable programmable read only memory (EEPROM) semiconductor device, comprising:

a memory section composed of cells adapted to be programmably addressed for writing data therein and reading data therefrom during selected write and read sequences of the device operation, and means operated only during a write sequence for detecting a predetermined low level of battery power to the device and thereupon aborting the write sequence in progress.

4. The invention of claim 3, in which:

the means for detecting includes means for placing the device in a reduced power mode upon detection of the predetermined low level of battery power.

5. A method of reducing power consumption while protecting against data corruption in a serial EEPROM having a supply voltage with a detectable level, which comprises:

detecting the level of the supply voltage of the EEPROM, placing the EEPROM in a reduced power mode when the supply voltage level is below a predetermined level, and performing said detecting of supply voltage level and lacing the EEPREOM in a reduced power mode only during an interval in which data is being written to the EEPROM.

6. The method of claim 5, in which said interval includes loading the data in a temporary storage cache, and writing the loaded data into the EEPROM.

7. The method of claim 5, further including aborting any operation in progress in the EEPROM during said interval in which the EEPROM is placed in the reduced power mode.

8. In a serial EEPROM semiconductor device having a memory array composed of cells adapted to be addressed for writing data to selected ones of the cells during selected write sequences and for reading data from selected ones of the cells during selected read sequences of the device operation, the improvement comprising:

control means, responsive when enabled, for detecting a power supply level to said device insufficient to sustain a faithful write of data to the selected cells during the selected write sequence, to thereupon abort the write sequence in progress so as to preclude data corruption of the memory array attributable to an incomplete write, and activation means for enabling said control means only during a write sequence, and disabling said control means at all other times during the device operation, to reduce the power consumption of the device attributable to the control means.

9. The improvement of claim 8, in which:

the control means includes means for placing the device in a reduced power mode upon detecting the insufficient power supply level.

* * * * *